United States Patent [19]

Muraoka

[11] Patent Number: 5,862,084
[45] Date of Patent: Jan. 19, 1999

[54] SEMICONDUCTOR MEMORY DEVICE

[75] Inventor: Yuji Muraoka, Tokyo, Japan

[73] Assignee: NEC Corporation, Tokyo, Japan

[21] Appl. No.: 995,973

[22] Filed: Dec. 22, 1997

[30] Foreign Application Priority Data

Dec. 20, 1996 [JP] Japan ................................ 8-340851

[51] Int. Cl.$^6$ .............................. G11C 16/04; G11C 7/00
[52] U.S. Cl. ............................... 365/189.05; 365/189.11; 365/226
[58] Field of Search .................... 365/189.05, 189.11, 365/226, 230.06, 230.08; 326/21, 62, 68, 81

[56] References Cited

U.S. PATENT DOCUMENTS

| | | | |
|---|---|---|---|
| 5,416,368 | 5/1995 | Sugibaysahi | 326/68 |
| 5,448,198 | 9/1995 | Toyoshima et al. | 326/81 |
| 5,680,068 | 10/1997 | Ochi et al. | 326/81 |

FOREIGN PATENT DOCUMENTS

| | | |
|---|---|---|
| 59-140689 | 8/1984 | Japan . |
| 62-239496 | 10/1987 | Japan . |

*Primary Examiner*—David Nelms
*Assistant Examiner*—Trong Phan
*Attorney, Agent, or Firm*—Sughrue, Mion, Zinn Macpeak & Seas, PLLC

[57] ABSTRACT

An output circuit for a semiconductor memory device includes at least an output transistor and a level conversion circuit. In this case, the level conversion circuit is connected to the output transistor. The output transistor is connected to a ground terminal and an output terminal. In this condition, the level conversion circuit converts an input signal in level and supplies the converted input signal to the output transistor as drive signal. With such a structure, a predetermined booster voltage is given to the level conversion circuit. Consequently, the ground potential appears at the output terminal without an access delay when the output transistor is turned on by the drive signal.

11 Claims, 2 Drawing Sheets

SEMICONDUCTOR MEMORY DEVICE

BACKGROUND OF THE INVENTION

This invention relates to a semiconductor memory device, and in particular, to a semiconductor memory device having output circuits for supplying output signals to outside.

Recently, a high integration and a high density have been realized in this kind of semiconductor memory device. Such a highly integrated circuit often has such a structure that a plurality of memory cells are divided into a plurality of memory arrays. In this case, an output circuit for amplifying a signal read from each memory cell is connected to each memory array because the read signal is excessively low in level. The output circuit amplifies the read signal to a level acceptable in a peripheral circuit such as an output device.

Such an output circuit generally receives two input signals which are complementary to each other and supplies an output signal corresponding to the input signals through an output terminal. More specifically, the output circuit has a pair of transistors which are connected in series between a first terminal and a second terminal. In this case, the first terminal is given a power supply voltage, while the second terminal is grounded. With such a structure, an output terminal is taken out from a point of connection common to both transistors. Further, drive signals corresponding to the two complementary input signals are given to input terminals (gates) of the transistors.

In this structure, the power supply voltage is given to the output terminal as the output signal when the transistor at the side of the first terminal which is given the power supply voltage is turned on in response to the two complementary input signals. On the other hand, the output terminal is grounded when the transistor at the side of the grounded second terminal is turned on in response to the two input signals.

Conventionally, Japanese Unexamined Patent Publication No. S62-239496 (reference 1) discloses such an output circuit that an output signal of a high level which is given to an output terminal is sufficiently raised up and further, the output signal is outputted at a high speed. To this end, suggestion has been made about the output circuit which has a booster circuit at an input side of a transistor of a power supply terminal side in the reference 1. In this event, the booster circuit raises an input signal to supply a raised-up voltage to the transistor.

On the other hand, Japanese Unexamined Patent Publication No. S59-140689 (reference 2) discloses an output circuit having a pair of output transistor and bootstrap drive circuits which are connected to gates of the transistors. In this case, the output transistors are structured by connecting a pair of MOS transistors to each other in series. With such a structure, consumption of a current continuously given can be remarkably saved by the use of the bootstrap drive circuit. This shows that a large capacity load can be driven by the gate of the output transistor. In other words, the output circuit dispenses with an amplifier, such a preamplifier, which is to be connected in front of the bootstrap drive circuit. In addition, the circuit can be simplified by connecting the bootstrap drive circuits to the input sides of the output transistors. In this event, the bootstrap circuit in the reference 2 is driven the same voltage as the power supply voltage of the output circuit.

None of the references 1 and 2 point out about a problem which occurs when an output circuit is arranged for each of a plurality of memory arrays and the ground terminals of all output circuits are commonly connected to a ground pad. More specifically, distances between the ground side output transistors in the output circuit and the ground pad are different from each other for each memory array. Consequently, an output potential of each output terminal is different for each memory array when the ground side output transistor is turned on so that the output terminal is electrically connected to the ground pad.

Taking the above into consideration, the output signal which is supplied to the output terminal quickly makes a transition to the high level when the booster circuit is connected to the transistor of the power supply terminal side, like in the reference 1. However, the output signal slowly makes a transition to the low level on the ground side as compared to the transition to the high level on the power supply terminal side. Consequently, an access delay of the output signal occurs in the transition to the low level. In addition, a noise becomes large with a fluctuation of the ground potential of each memory cell in the structure of the reference 1.

Further, the access delay on the transition to the low level of the output signal can not be prevented even when the bootstrap drive circuit is given the same voltage as the power supply voltage and is connected on the input side of each output transistor.

SUMMARY OF THE INVENTION

It is therefore object of this invention to provide a semiconductor memory device which is capable of preventing an access delay on a transition to a low level of an output signal.

It is another object of this invention to provide a semiconductor memory device which is capable of reducing an affect due to a vibration of a ground level when an output circuit is connected to each memory array.

It is still another object of this invention to provide an output circuit which is capable of preventing a fluctuation of a ground potential when an output transistor at a ground side is turned on.

According to this invention, an output circuit for a semiconductor memory device includes at least an output transistor and a level convert circuit. In this case, the level convert circuit is connected to the output transistor. The output transistor is connected to a ground terminal and an output terminal. In this condition, the level convert circuit converts an input signal in level and supplies the converted input signal to the output transistor as drive signal. With such a structure, a predetermined booster voltage is given to the level convert circuit. Consequently, the ground potential appears at the output terminal without an access delay when the output transistor is turned on by the drive signal.

DESCRIPTION OF THE PREFERRED EMBODIMENT

Figure 1:
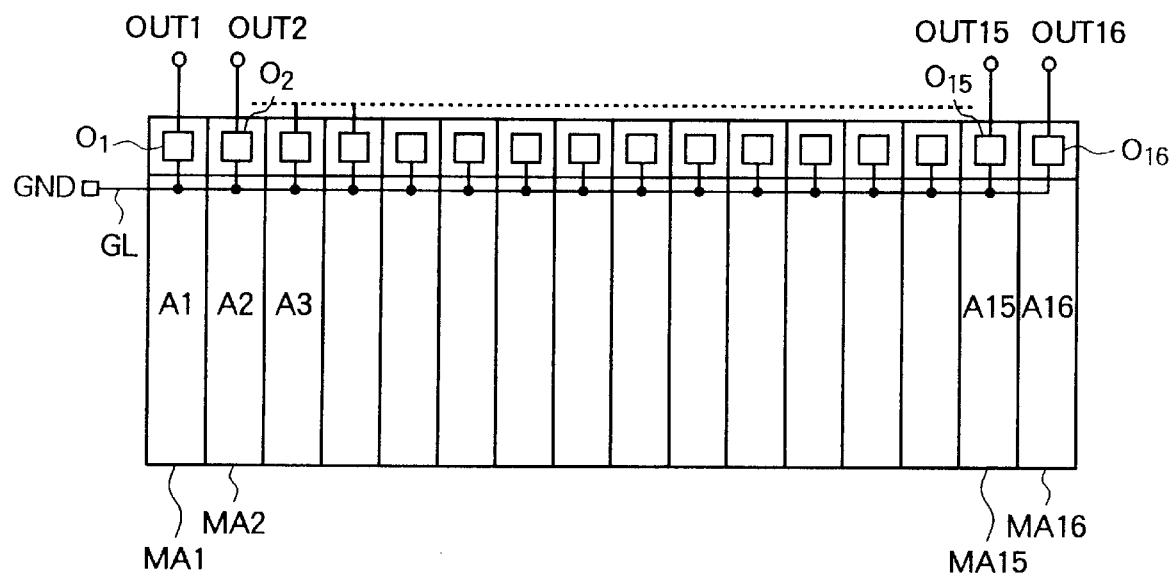
FIG. 1 is a schematic view of a semiconductor memory device applicable to this invention.

Referring to FIG. 1, description will be made about a semiconductor memory device of an embodiment according to this invention.

In FIG. 1, a 16M DRAM is generally illustrated as the semiconductor memory device. The illustrated semiconductor memory device is divided into sixteen memory arrays MA1 to MA16 each of which has a memory capacity of 1M. Each of the memory arrays MA1 to MA16 includes an array portion A1 to A16 having memory cells of 1M and an output circuits 01 to 016 in the illustrated example.

The output circuits 01 to 016 are connected to the corresponding array portions A1 to A16 and receive read signals from the array portions A1 to A16 to supply output signals to output terminals OUT1 to OUT16. The output circuits 01 to 016 are connected to a ground pad GND via a common ground line GL. With this structure, an output signal of 1 bit is read from each of the memory arrays MA1 to MA16. Consequently, output signals of 16 bits in total are simultaneously supplied to an external peripheral circuit (not shown) via the output terminals OUT1 to OUT16. Although the illustrated output circuits 01 to 016 are provided for the respective memory arrays MA1 to MA16, the output circuit may be arranged in accordance with a group number of the memory arrays where each memory array MA1 to MA16 is divided into a plurality of groups (for example, 16 or 32).

As illustrated in FIG. 1, each of the memory arrays MA1 to MA 16 is connected to the ground pad GDN via the ground line GL. Therefore, a ground potential which is given to each of the output circuits 01 to 016 fluctuates with a distance from the ground pad GND.

Figure 2:
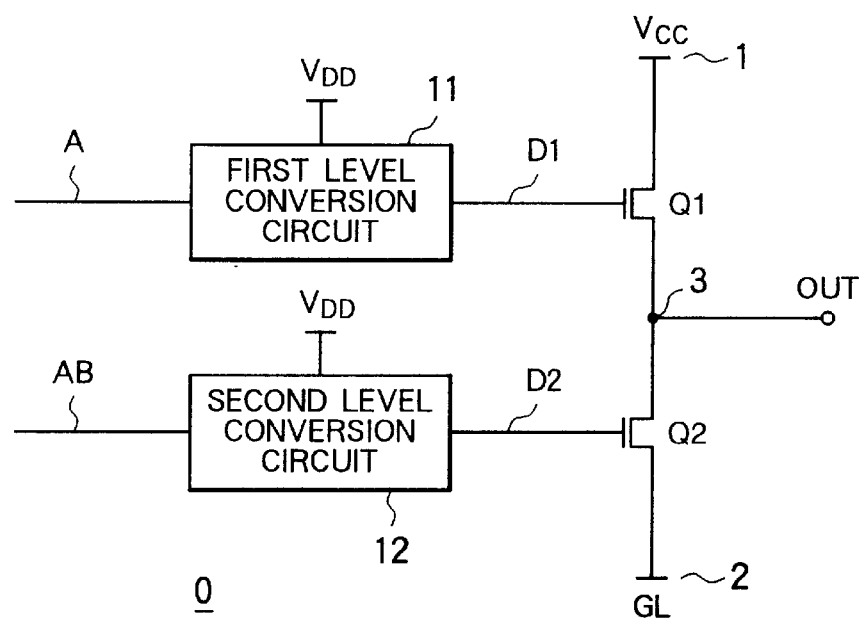
FIG. 2 is a schematic view showing an output circuit according to an embodiment of this invention.

Referring to FIG. 2, detail description will be made about an output circuit 0 which is used as each of the output circuits 01 to 016 in FIG. 1.

The illustrated output circuit 0 has a power supply terminal 1 which is given a power supply voltage Vcc (for example, 5 V), and a ground terminal 2 which is connected to the ground line GL and which is given a ground potential. First and second MOS transistors Q1 and Q2 are connected in series between both the terminals 1 and 2. Namely, a source of the first MOS transistor Q1 is connected to a drain of the second MOS transistor Q2, while a drain of the first MOS transistor Q1 and a source of the second MOS transistor Q2 are connected to the power supply terminal 1 and the ground terminal 2, respectively. A common connection point 3 between the first and second MOS transistors Q1 and Q2 is connected to an output terminal OUT.

Further, a gate of the first MOS transistor Q1 is connected to a first level conversion circuit 11, while a gate of the second MOS transistor Q2 is connected to a second level conversion circuit 12. The first and second level conversion circuits 11 and 12 are supplied with read signals from the memory cell as complementary input signals A and AB. The input signals A and AB are subjected to level conversion by the first and second level conversion circuits 11 and 12, and are supplied to the first and second MOS transistors Q1 and Q2 as first and second drive signals D1 and D2.

As shown in FIG. 2, a voltage $V_{DD}$, which is different from the power supply voltage $V_{CC}$, is given to the first and second level conversion circuits 11 and 12. In this case, the voltage $V_{DD}$ is higher than the power supply voltage $V_{CC}$. Thus, the first and second level conversion circuits 11 and 12 are connected to a booster circuit.

Subsequently, an operation of the illustrated output circuit 0 will be described below.

The output circuit 0 operates as follows when a high level signal and a low level signal are given as the first and second input signals A and AB, respectively. Namely, the first level conversion circuit 11 supplies a zero level (low level) as the first drive signal D1 to the gate of the first MOS transistor Q1. Consequently, the first MOS transistor Q1 is put into an off state.

On the other hand, the second level conversion circuit 12 converts the second input signal AB of the low level into a voltage which is higher than the power source voltage Vcc and supplies the converted voltage to the second MOS transistor Q2 as the second drive signal D2. Consequently, the second MOS transistor Q2 is put into an on state.

As a result, the ground potential is given to the output terminal OUT as an output signal via the second transistor Q2. In this event, a sufficient gate-source voltage can given for the the second MOS transistor Q2 because the second MOS transistor Q2 is driven by a drive signal D2 of a high amplitude. Consequently, the second MOS transistor Q2 rapidly makes a transition to the on state. Therefore, no access delay occurs by noises and like when the second MOS transistor Q2 is put into the on state.

On the other hand, the output circuit 0 operates as follows when a low level signal and a high level signal are given as the first and second input signals A and AB, respectively. Namely, the first level conversion circuit 11 supplies a higher voltage than the power supply voltage $V_{CC}$ as the first drive signal D1 to the gate of the first MOS transistor Q1, while the second conversion circuit 12 supplies a zero level (low level) as the second drive signal D2. Consequently, the first MOS transistor Q1 is put into an on state, while the second MOS transistor Q2 is put into an off state. As a result, the power supply voltage Vcc is given to the output terminal OUT as the output signal via the first transistor Q2.

Figure 3:
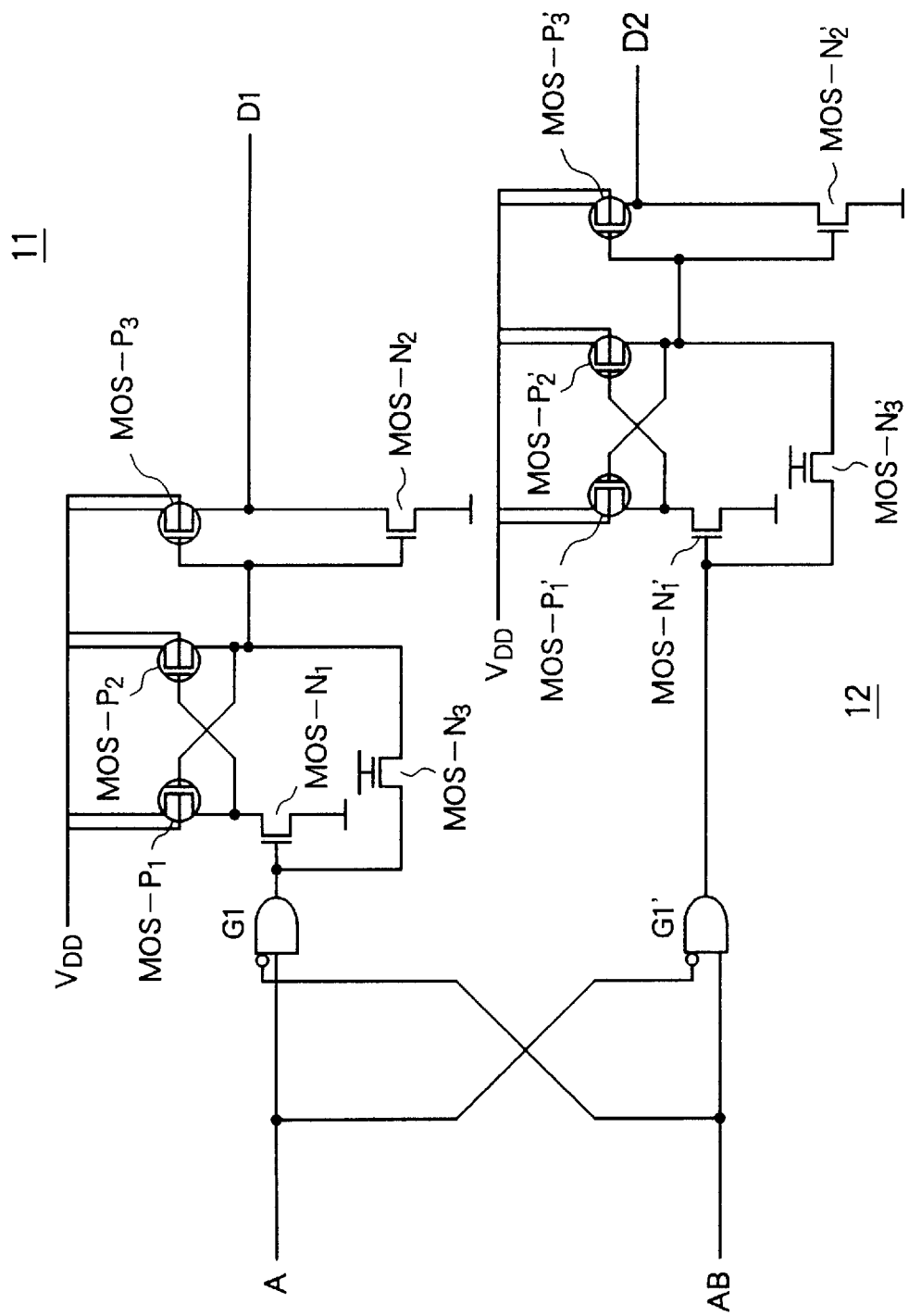
FIG. 3 is a detail circuit diagram of a level convert circuit in FIG. 2.

Referring to FIG. 3, a specific example of the first and second level conversion circuits 11 and 12 in FIG. 2 will be described below.

The complementary input signals A and AB are given to the first and second level conversion circuits 11 and 12, like in FIG. 2. The illustrated first level conversion circuit 11 has an AND gate G1 which are given the input signals A and AB. The output of the gate G1 is supplied to a gate of an N-channel MOS transistor MOS-N1. Further, the first level conversion circuit 11 has a pair of P-channel MOS transistors MOS-P1 and MOS-P2 which are connected with drains and gates to each other. In this event, sources of the both P-channel MOS transistors MOS-P1 and MOS-P2 are connected to a booster voltage $V_{DD}$. The drain of the MOS-N1 is connected to the drain and the gate of the MOS-P1 and the MOS-P2, respectively. The common connection point between the gate of the MOS-P1 and the drain of the MOS-P2 is connected to a gate of a P-channel MOS transistor MOS-P3 and a gate of a N-channel MOS transistor MOS-N2, respectively. In this event, the first drive signal D1 is supplied from the drain which is commonly connected to both the MOS-P3 and MOS-N2.

In addition, an N-channel MOS transistor MOS-N3 is connected between the common connection point of the drain of the MOS-P2 and the gate of the MOS-P1 and the gate of the MOS-N1. The MOS-N3 becomes a cutoff state to prevent a current from reversely flowing to the MOS-N1 which is given the power source voltage $V_{cc}$ when the MOS-P2 is put into an on state so that the booster voltage ($V_{DD}$) is given.

Similarly, the second level conversion circuit 12 comprises an AND gate G1', a MOS-N1', a MOS-P1', a MOS-P2', a MOS-P3' and a MOS-N2' and complementarily operates for the first level conversion circuit 11. Further, sources of the MOS-P1', the MOS-P2' and the MOS-P3' are connected to the booster voltage $V_{DD}$, like the first level conversion circuit 11. In this case, an N-channel MOS transistor MOS-N3' is also connected between the MOS-P2' and the MOS-N1' of the second level conversion circuit 12 to prevent the reverse flow of the current.

In addition, Not signals of the input signals AB and A are given to the first and second AND gates G1 and G2 in the illustrated example.

Subsequently, an operation of the first and second level conversion circuits 11 and 12 will be described when a high level signal and a low level signal are given as the first and second input signals A and AB.

The drain of the MOS-N1 becomes a low level in the first level conversion circuit 11 because a high level signal is given from the gate G1. Consequently, the MOS-P2 is put into an on state, and the booster voltage $V_{DD}$ is given to the drain of the MOS-P2. As a result, the MOS-P1 is put into an off state. On the other hand, the booster voltage $V_{DD}$ is given to the drain of the MOS-P2 and thereby, the MOS-P3 is put into an off state and the MOS-N2 is put into an on state. Consequently, a ground potential is given to the drain of the MOS-N2. In this case, the first drive signal D1 of the ground potential is rapidly outputted because the MOS-N2 is driven with the booster voltage.

On the other hand, the MOS-N1' and the MOS-P2' is put into an off state in the second level conversion circuit 12 because low level signal is supplied from the gate G2. Consequently, the drain of the MOS-P2' is grounded. As a result, the MOS-P3' whose gate is connected to the drain of the MOS-P2' is put into an on state. Thereby, the booster voltage ($V_{DD}$) is supplied to the drain of the MOS-P3' as the second drive signal D2.

Thus, the transistor Q2 in FIG. 2 can rapidly become the ground potential to prevent the vibration of the ground potential, since the booster voltage is supplied the second level conversion circuit 12.

What is claimed is:

1. An output circuit for a semiconductor memory device, comprising:
    a first terminal which is given a power supply voltage;
    a second terminal which is given a ground potential;
    first and second transistors which are connected between the first and second terminals;
    a first level conversion circuit which is connected to the first transistor and which converts a first input signal in level and supplies the converted first signal to said first transistor as a first drive signal;
    a second level conversion circuit which is connected to the second transistor and which converts a second input signal in level and supplies the converted second signal to said second transistor as a second drive signal; and
    an output terminal which is connected between the first and second transistors;
    a predetermined booster voltage different from the power supply voltage being given to the first and second conversion circuits;
    wherein said first and second input signals include a signal read from one of a plurality of memory cells contained within an array portion of a plurality of memory arrays.

2. The circuit claimed in claim 1, wherein:
    said first and second transistors comprise first and second MOS transistors each of which has a source, a drain and a gate,
    the drain of the first MOS transistor is connected to the first terminal,
    the source of the second MOS transistor is connected to the second terminal, and
    the source of the first MOS transistor and the drain of the second MOS transistor are connected to the output terminal.

3. The circuit claimed in claim 2, wherein:
    said first level conversion circuit is connected to the gate of the first MOS transistor, and
    said second level conversion circuit is connected to the gate of the second MOS transistor.

4. The circuit claimed in claim 1, wherein:
    the predetermined booster voltage is higher than the power supply voltage.

5. The circuit claimed in claim 1, wherein:
    complementary signals are supplied to said first and second level conversion circuits as the first and second input signals.

6. The circuit claimed in claim 5, wherein:
    said second level conversion circuit converts the second input signal of a low level into the second drive signal of a high level signal by use of the predetermined booster voltage to supply the second drive signal to said second transistor;
    whereby said second transistor is rapidly put into an on state by the second drive signal so that the ground potential appears at the output terminal without an access delay.

7. An output circuit for a semiconductor memory device, comprising:
    a ground terminal which is given a ground potential;
    an output transistor which is connected to the ground terminal;
    a level conversion circuit which is connected to the output transistor and which converts an input signal in level and supplies the converted input signal to said output transistor as a drive signal; and
    an output terminal which is connected to said output transistor;
    a predetermined booster voltage being given to said level conversion circuit so that the ground potential appears at the output terminal without an access delay when said output transistor is turned on by the drive signal;
    wherein said input signal includes a signal read from one of a plurality of memory cells contained within an array portion of a plurality of memory arrays.

8. The circuit claimed in claim 7, wherein:
    said transistors comprises a MOS transistors which has a source, a drain and a gate,
    the source is connected to the ground terminal,
    the drain is connected to the output terminal, and
    the gate is connected to said level conversion circuit.

9. A semiconductor memory device comprising;
    a plurality of memory arrays each of which includes an array portion having a plurality of memory cells and an output circuit which is given a signal read from one of the plurality of memory cells;
    a ground terminal which is given a ground potential;
    a ground line which is connected to the ground terminal;
    a plurality of output transistors each of which is provided in said output circuit and which are connected to said ground terminal via the ground line;
    a plurality of level conversion circuits each of which is arranged in said output circuit and each of which is given a signal read from the memory cell as an input signal, converts the input signal in level and supplies the converted input signal to said transistor as a drive signal.

10. The device as claimed in claim 9, wherein:
    at least one of said transistors comprises a MOS transistor.

11. The device as claimed in claim 9, wherein:
    a predetermined booster voltage is given to at least one of said level conversion circuits.

* * * * *